United States Patent [19]
Maher et al.

[11] Patent Number: 5,248,371
[45] Date of Patent: Sep. 28, 1993

[54] HOLLOW-ANODE GLOW DISCHARGE APPARATUS

[75] Inventors: Joseph A. Maher, South Hamilton; Martin A. Kent, Andover, both of Mass.

[73] Assignee: General Signal Corporation, Stamford, Conn.

[21] Appl. No.: 929,099

[22] Filed: Aug. 13, 1992

[51] Int. Cl.$^5$ ............................................. H01L 21/00
[52] U.S. Cl. .................................. 156/345; 156/643; 118/723 E
[58] Field of Search ................ 156/345, 643; 118/715, 118/723; 204/298.31, 298.33, 298.34

[56] References Cited

U.S. PATENT DOCUMENTS

| | | | |
|---|---|---|---|
| 4,318,767 | 3/1982 | Hijikata et al. | 156/345 |
| 4,349,409 | 9/1982 | Shibayama et al. | 156/345 X |
| 4,405,435 | 9/1983 | Tateishi et al. | 204/298 |
| 4,477,311 | 10/1984 | Mimura et al. | 156/643 |
| 4,498,416 | 2/1985 | Bouchaib | 118/719 |
| 4,534,314 | 8/1985 | Ackley | 118/733 |
| 4,542,712 | 9/1985 | Sato et al. | 118/726 |
| 4,547,247 | 10/1985 | Warenback et al. | 156/345 |
| 4,548,699 | 10/1985 | Hutchinson et al. | 204/298 |
| 4,550,239 | 10/1985 | Uehara et al. | 219/121 PG |

(List continued on next page.)

FOREIGN PATENT DOCUMENTS

| | | | |
|---|---|---|---|
| 0165400 | 12/1985 | European Pat. Off. | |
| 0272141 | 6/1988 | European Pat. Off. | |
| 55-141570 | 11/1980 | Japan . | |
| 60-39832 | 3/1985 | Japan | 156/345 |
| 60-238134 | 11/1985 | Japan | 156/345 |
| 1-50335 | 7/1986 | Japan | 156/345 |
| 61-239626 | 10/1986 | Japan . | |
| 62-286227 | 12/1987 | Japan | 156/345 |
| 2-19129 | 9/1988 | Japan | 156/345 |
| 1-4481 | 1/1989 | Japan . | |
| WO87/06561 | 11/1987 | PCT Int'l Appl. . | |
| 2156451A | 10/1985 | United Kingdom . | |
| 2171978A | 9/1986 | United Kingdom . | |

OTHER PUBLICATIONS

Chapman, Brian, "Glow Discharge Processes-Sputtering and Plasma Etching," *Plasma Etching*, John Wiley & Sons, Inc., New York, ©1980, pp. 326-329.

(List continued on next page.)

*Primary Examiner*—Brian E. Hearn
*Assistant Examiner*—Jonathan D. Baskin
*Attorney, Agent, or Firm*—Weingarten, Schurgin, Gagnebin & Hayes

[57] ABSTRACT

Hollow-anode glow discharge apparatus in the form of two-electrode and three-electrode reactors provide, in various embodiments, improved uniformity, efficiency and low-pressure substrate surface processing. In one improved uniformity embodiment for ion-dominated processes, the apparatus of the invention includes a high-energy-density uniformizing grid having multiple, multi-sized and evenly-spaced holes. In one improved uniformity embodiment for chemically-dominated processes, the apparatus of the invention includes a high-energy-density uniformizing grid having multiple, evenly-spaced holes and a stepped or continuously-variable non-planar profile. In one improved low pressure embodiment for ion-dominated and/or chemically-dominated processes, the apparatus of the invention includes a high-energy-density grid having multiple, evenly-sized and spaced holes of widths large enough to overcome dark space effects. In one improved efficiency selected ion energy embodiment for ion-dominated and/or chemically-dominated processes, the apparatus of the invention includes a high-energy-density source that synergistically cooperates with an apertured grid to provide selected-energy ions at higher densities than heretofore possible. In any embodiment, both build-up on and removal from the substrate are possible.

22 Claims, 8 Drawing Sheets

U.S. PATENT DOCUMENTS

| | | | |
|---|---|---|---|
| 4,563,240 | 1/1986 | Shibata et al. | 156/643 |
| 4,584,045 | 4/1986 | Richards | 156/345 |
| 4,587,002 | 5/1986 | Bok | 204/298 |
| 4,592,306 | 6/1986 | Gallego | 118/719 |
| 4,622,918 | 11/1986 | Bok | 118/718 |
| 4,631,105 | 12/1986 | Caroll et al. | 156/345 |
| 4,661,196 | 4/1987 | Hockersmith et al. | 156/345 |
| 4,661,228 | 4/1987 | Mintz | 204/192.25 |
| 4,664,062 | 5/1987 | Kamohara et al. | 118/719 |
| 4,668,338 | 5/1987 | Maydan et al. | 156/643 |
| 4,668,365 | 5/1987 | Foster et al. | 204/192.23 |
| 4,670,126 | 6/1987 | Messer et al. | 204/298 |
| 4,674,621 | 6/1987 | Takahashi | 198/378 |
| 4,675,096 | 6/1987 | Tateishi et al. | 204/298 |
| 4,705,951 | 11/1987 | Layman et al. | 250/442.1 |
| 4,713,551 | 12/1987 | Layman et al. | 250/561 |
| 4,715,764 | 12/1987 | Hutchinson | 414/217 |
| 4,715,921 | 12/1987 | Maher et al. | 156/345 |
| 4,717,461 | 1/1988 | Strahl et al. | 204/192.1 |
| 4,724,621 | 2/1988 | Hobson et al. | 34/218 |
| 4,756,815 | 7/1988 | Turner et al. | 204/298 |
| 4,763,602 | 8/1988 | Madan et al. | 118/719 |
| 4,770,590 | 9/1988 | Hugues et al. | 414/172 |
| 4,775,281 | 10/1988 | Prentakis | 414/416 |
| 4,776,918 | 10/1988 | Otsubo et al. | 156/345 |
| 4,780,169 | 10/1988 | Stark et al. | 156/345 |
| 4,792,378 | 12/1988 | Rose et al. | 156/345 X |
| 4,825,808 | 5/1989 | Takahashi et al. | 118/719 |
| 4,851,101 | 7/1989 | Hutchinson | 204/298 |
| 4,852,516 | 8/1989 | Rubin et al. | 118/715 |
| 4,854,263 | 8/1989 | Chang et al. | 118/725 X |
| 4,951,601 | 8/1990 | Maydan et al. | 118/719 |
| 4,957,588 | 9/1990 | Koshiba et al. | 156/345 X |
| 4,971,653 | 11/1990 | Powell et al. | 156/345 X |
| 5,013,385 | 5/1991 | Maher et al. | 156/345 |
| 5,013,400 | 5/1991 | Kurasaki et al. | 156/643 |
| 5,102,495 | 4/1992 | Maher et al. | 156/643 |

OTHER PUBLICATIONS

Horiike, Y., "Chapter 14: Emerging Etching Techniques," *VLSI Electronics Microstructure Science*, vol. 8, Academic Press, Inc. (Harcourt Brace Jovanovich, Publishers), ©1984, pp. 448–450.

IBM Technical Disclosure Bulletin, vol. 29, No. 1, Jun. 1986, entitled "Vacuum-Compatible Wafer Handler," (2 pages).

Itakura, Hideaki, et al., "Multi-Chamber Dry Etching System," *Solid State Technology*, Apr. 1986, pp. 209–214.

Maher, Joseph A., Jr., "Plasma Etching of Aluminum and Its Alloys," Report of LFE Corporation, Process Control Division, 1601 Trapelo Rd., Waltham, Mass. 02154, undated, pp. 1-15 plus FIG. 9.

Moslehi, M. M., et al., "Low-temperature direct nitridation of silicon in nitrogen plasma generated by microwave discharge," *J. Appl. Phys.* 58 (6), 15 Sep. 1985, pp. 2416–2419.

Drytek Brochure entitled "Quad System" ©Drytek Inc. 1985, consisting of 11 pages of advertisement, published by Drytek, Inc., 16 Jonspin Road, Wilmington, Mass. 01887.

"Dry Etching Systems," *Semiconductor International*, a Cahners Publication, Oct. 1985, pp. 49–60.

Declaration of Mr. Mark W. Miller, filed in appln. S/N 07/115,774 consisting of 9 pages of Declaration and 30 pages of enclosures to the Declaration.

Declaration of Mr. Joseph A. Maher, filed in appln. S/N 06/853,775 consisting of 4 pages of Declaration and one sheet of FIG. 1 as enclosure to the Declaration.

Declaration of Mr. Arthur W. Zafiropoulo, filed in appln. S/N 06/853,775 consisting of 5 pages of Declaration and 12 pages of enclosures to the Declaration.

Declaration of Mr. Leslie G. Jerde, filed in appln. S/N 06/853,775 consisting of 5 pages of Declaration and 12 pages of enclosures to the Declaration.

The System 1000, The Semi Group RIE System 100 TC, 6 pages, believed to be published sometime before Mar. 1985, printed in California and available as a machine data sheet in the United States.

GIR 200, Plasma Cassette to Cassette R.I.E.-Planar Plasma Etcher, CIT Alcatel, 10 pages, believed to be published sometime before Feb. 1984, printed in France and available as a machine data sheet in the U.S.

Omni-Etch 10000 Dry Processing System, Perkin-Elmer, 8 pages, dated Sep. 1982, available as a machine data sheet in the United States.

Vactronic PDS-5000 Distributed Multichamber Plasma Processing System, 4 pages, believed to be available sometime in 1981, printed in New York and available as a machine data sheet in the United States.

AutoEtch 480 . . . , 3 pages, believed to be published by Apr. 1982, and available as a machine data sheet in the United States.

Reactive Ion Etching Parameters, Anelva, 4 pages, dated Jan. 1981, printed in California and available as a machine data sheet in the United States.

Single Wafer, High Throughput Plasma Inline 801 Polysilicon and Nitride Etcher, Tegal Corp., 4 pages, Oct. 24, 1983, press release.

Plasma Inline 803 Oxide Dry Etcher, Tegal Corp., 5 pages, dated 1983, printed in California and available as a machine data sheet in the United States.

5000 Planar Etcher, Dionex, 4 pages, Bulletin No. 5000, dated 1979, printed in California and available as a machine data sheet in the United States.

(List continued on next page.)

OTHER PUBLICATIONS

Dionex 5400: Programmable Planar System, 4 pages, Bulletin No. 5400, dated 1979, printed in California and available as a machine date sheet in the United States.

1521, Cassette-to-cassette RIE/plasma production etcher, Tegal Corp., 1 page, apparently dated Apr. 27, 1984, printed in California and available as a machine data sheet in the United States.

1522, Cassette-to-cassette RIE/plasma production etcher, Tegal Corp., 1 page, apparently dated Apr. 27, 1984, printed in California and available as a machine data sheet in the United States.

Fundamentals of Plasma-Etching, Dionex, 8 pages, Bulletin No. 70001, dated 1979, printed in California and available as a machine data sheet in the United States.

Series 5400SCC Cassette-to-Cassette Planar Etcher, Dionex, 2 pages, Bulletin No. 5400SCC, dated 1978, printed in California and available as a machine data sheet in the United States.

Engle, F., "The Multiple Modular-Unit Alternative for Wafer Processing," *Microelectronic Manufacturing and Testing*, Mar. 1982, pp. 9-11.

Lam, D. K., "Advances in VLSI Plasma Etching," *Solid State Technology*, Apr. 1982, 5 pages.

"Plasma-Sette System, Broader Applications with Good Competitive Results," *Airco Temescal Technical Service Bulletin*, No. 83-1, Mar. 4, 1983, pp. 1-9.

Cassette-to-Cassette Load-Lock Plasma/RIE System Plasma Sette II, Temescal, 12 pages, dated May 1983, printed in California and available as a machine data sheet in the United States.

"3-D Interconnect Technologies for VLSI Devices: Dry Processing," Strategic Inc., Feb. 1984, pp. 1-143.

The IPC 6420 Aluminum Etching System, Branson-/IPC, 11 pages, believed to be available before Feb. 1984, printed in California and available as a machine data sheet in the United States.

Sputtering Systems, Dry Etching Systems and Its Applications, Ulvac Corp., 24 pages, dated sometime in 1983, printed in Japan and available as a machine data sheet in the United States.

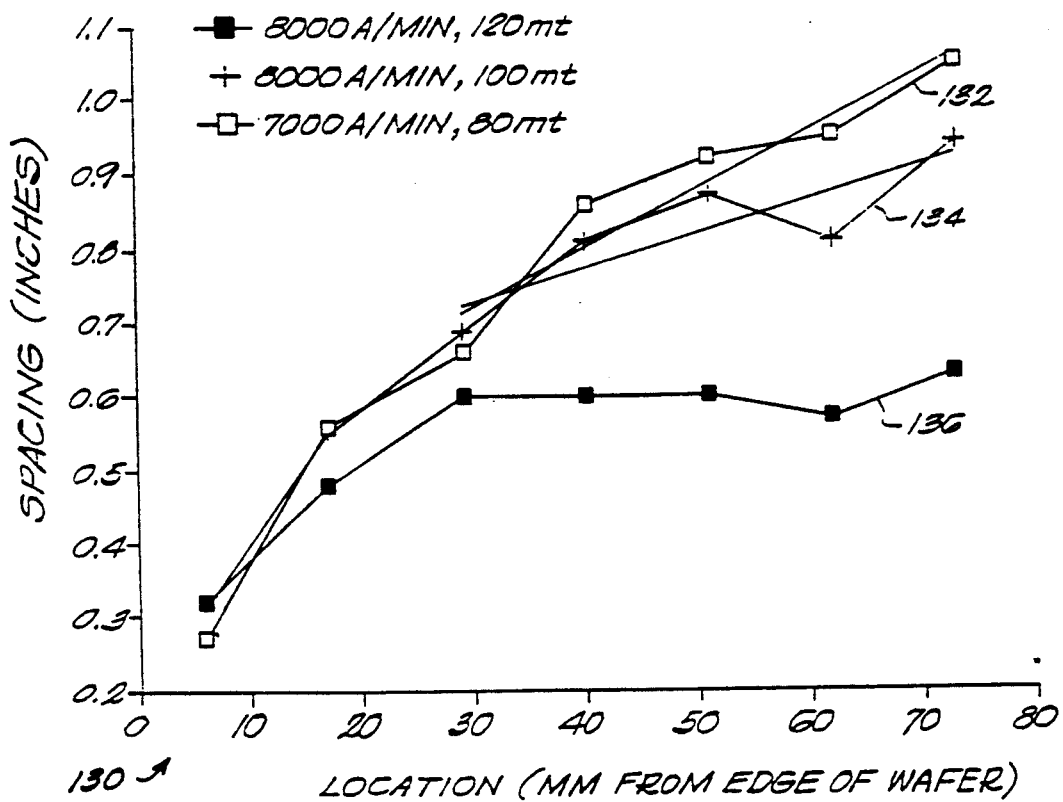
FIG. 7
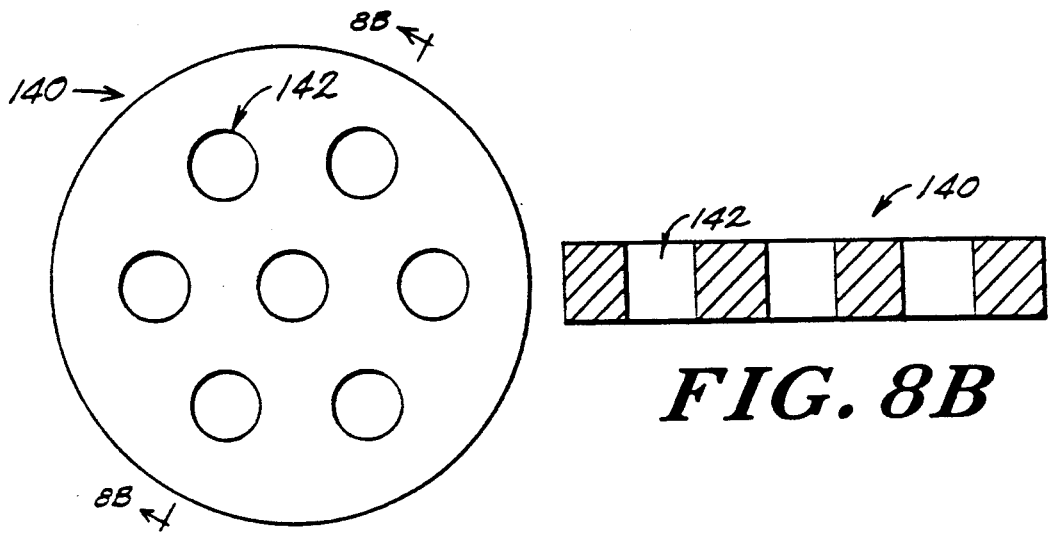
FIG. 8A
FIG. 8B

HOLLOW-ANODE GLOW DISCHARGE APPARATUS

FIELD OF THE INVENTION

The instant invention is drawn to the field of substrate processing, and more particularly, to a novel glow-discharge substrate surface processing apparatus providing improved uniformity, efficiency and low-pressure operation.

BACKGROUND OF THE INVENTION

There are generally two types of single-substrate substrate surface processing apparatus. In one form thereof, a substrate surface processing medium, such as a plasma, is controllably produced by two electrodes in a diode configuration, and in another form thereof, the substrate surface processing medium is controllably produced by three electrodes in a triode or other three-electrode configuration. For such machines, one or more selected surface processing media are caused to interact with suitably prepared surfaces of semiconductor wafers or other materials to form intended microstructures thereon and/or to remove unwanted residues therefrom that remain from one or more prior substrate surface processing steps. The model "384" diode reactor, commercially available from the instant assignee, and the model Wafer Etch 606/616 Triode Reactor, commercially available from GCA Corporation, are among the diode and triode reactors known to those skilled in the art. For the diode reactors, the substrate surface processing medium, such as a plasma, is controllably produced between the two electrodes in the diode configuration, while in the triode reactors, the substrate surface processing media, such as plasmas, are controllably produced between the upper electrode and the grid electrode on the one hand and between the grid electrode and the lower electrode on the other hand.

There are generally two types of substrate surface processing media controllably produced by the single-substrate substrate surface processing reactors in either the diode or triode configurations. For some types of substrate surface processing, such as for etching oxide or other materials on semiconductor wafers or other substrates, these reactors produce substrate surface processing media constituted principally by selected ions, while in other types of substrate surface processing, such as for chlorine etching of aluminum or other materials on semiconductor wafers or other substrates, these reactors produce substrate surface processing media constituted principally by certain selected chemical species. The former type of processing is known as "ion-dominated" processing while the latter type is known as "chemically-dominated" processing. Ion-dominated and chemically-dominated processing, in dependence on the specific microstructure being formed and on the phase of the overall fabrication process, may controllably effect either a build-up on (deposition, growth and the rest) or a removal from (etching and the rest) the surface of the substrate.

The utility of the heretofore known reactors in either the triode or diode configurations for both ion-dominated and chemically-dominated processing has been limited in respect to the degree of uniformity of substrate surface processing able to be obtained. In the application to very large scale integration (VLSI), for example, where more integrated circuits are being fabricated on ever larger semiconductor wafers, the effective yield of manufactured devices depends on the degree of uniformity obtained by the substrate surface processing apparatus. As the radial size of the wafer is increased to provide greater yield of integrated circuit devices to be fabricated per substrate, the difficulty of obtaining uniformity over the entire wafer becomes correspondingly more severe. Since device yield is directly proportional to the degree of uniformity obtained, the art of machine design is advanced to the same degree that substrate surface processing uniformity may be improved.

The utility of the heretofore known reactors in either the diode or triode electrode configurations has been further limited in respect to the pressures at which selected ion-dominated and chemically-dominated processing were able to be efficiently run on semiconductor wafers and other substrates. In the application to VLSI, where, for example, it is desirable to fabricate microstructures with ever smaller features, the fineness and scale of the detail able to be fabricated depends on the pressure in the reactors. As the pressures are reduced at which the selected ion-dominated and chemically-dominated processes are run, the fineness and scale of the microstructures able to be fabricated thereby are correspondingly increased. However, below a certain pressure, about seventy (70) mTorr for the reactors in the triode configuration and about eight hundred (800) mTorr for the reactors in the diode configuration, the efficiency of the heretofore known substrate surface processing apparatus became too low to provide practicable processing, which has "frozen" the fineness and scale of the microstructures that have heretofore been able to be fabricated at levels that are larger and coarser than what are otherwise desirable. Since the degree of fineness and scale of the microstructures able to be fabricated is inversely proportional to the pressure level in these reactors, the art of machine design is advanced to the same degree that lower pressure processing may be able to be efficiently obtained.

SUMMARY OF THE INVENTION

Accordingly, the present invention discloses as its principal object a substrate surface processing apparatus, in either a diode or a triode or other multi-electrode configuration, providing improved uniformity, efficiency and low-pressure operation for ion-dominated and/or chemically-dominated processing for substrate build-up and/or removal. In accord with one embodiment thereof for improved-uniformity ion-dominated processing, the apparatus of the invention includes a reaction vessel; at least first and second spaced-apart electrodes mounted in the reaction vessel and defining a substrate surface processing medium forming region between the first and second spaced-apart electrodes; a substrate holder proximate one of the electrodes; gas injecting means for injecting substrate surface processing medium forming reactants into the reaction vessel; at least one source of electrical excitation; coupling means connected between the at least one source of electrical excitation and the at least first and second spaced-apart electrodes to ground one of the electrodes while powering the other of the electrodes in a manner to induce a hollow-anode glow discharge in said grounded one of the electrodes; said grounded one of said electrodes having at least first and second groups of holes therethrough in which said hollow-anode glow discharge occurs; the holes of the at least first and second groups of holes are of preselected different characteristics selected to provide substantial uniformity of substrate surface processing over the entire surface of the substrate. In the exemplary improved-uniformity ion-dominated processing embodiment, the preselected characteristics of the holes of the at least first and second groups of holes of the grounded electrode are selected to be differential sizing.

In further accord therewith and in one exemplary embodiment for improved-uniformity chemically-dominated processing, the apparatus of the invention includes a reaction vessel; at least first and second spaced-apart electrodes mounted in the reaction vessel and defining a substrate surface processing medium forming region between the first and second spaced-apart electrodes; a substrate holder for holding a substrate proximate one of said electrodes; a gas injector for injecting reactants into the reaction vessel; a source of electrical excitation; coupling means connected between the source of electrical excitation and said at least first and second spaced-apart electrodes to ground one of said electrodes and to power the other of said electrodes to induce a hollow-anode glow discharge in said grounded one of said electrodes; said grounded one of said electrodes having at least one hole thereinthrough in which said hollow-anode glow discharge occurs; said grounded one of said at least first and second electrodes having a preselected non-planar profile that departs from planarity in a manner selected to provide substantial uniformity of substrate surface processing over the entire surface of the substrate. In the exemplary improved-uniformity chemically-dominated processing embodiment, the preselected non-planar profile is selected to be concave. Continuous non-planar profiles other than concave profiles and non-planar "stepped" profiles may be employed without departing from the inventive concept.

In further accord therewith and in one embodiment for improved low-pressure processing for selected ion-dominated and/or chemically-dominated processing the apparatus of the invention includes a reaction vessel; at least first and second spaced-apart electrodes mounted in the reaction vessel and defining a substrate surface processing medium forming region between the first and second spaced-apart electrodes; a substrate holder for releasably holding a substrate proximate one of said first and second spaced-apart electrodes; a gas injector for injecting substrate surface processing reactants into the reaction vessel; a source of electrical excitation; coupling means connected between the source of electrical excitation and the first and second spaced-apart electrodes to ground one of said electrodes while powering the other of the electrodes to induce a hollow-anode glow discharge in said grounded one of said at least first and second electrodes; pressure control means for selectively establishing a preselected pressure in the reaction vessel selected to be below one hundred (100) mTorr; said one of said electrodes that is grounded having a plurality of holes thereinthrough in which said hollow-anode glow discharge occurs of preselected width selected to be larger than four and nine tenths (4.9) mm. In accord with the present invention, the size of the holes of the grounded grid electrode controls the manner that the hollow-anode glow discharge occurs therein and enables to provide substrate surface processing at lower pressures and to fabricate microstructures of correspondingly finer detail and scale than heretofore thought possible.

In further accord therewith and in one embodiment for improved low-pressure, selected-energy ion-dominated and/or chemically-dominated processing, the apparatus of the invention includes a reaction vessel; a high energy source providing ions; first and second electrodes spaced apart from each other and the high-energy source and mounted in the reaction vessel defining a first substrate surface processing medium forming region between the high-energy source and one of the first and second spaced-apart electrodes and defining a second substrate surface processing medium forming region between said first and second spaced-apart electrodes; a holder for releasably holding a substrate proximate one of said first and second spaced-apart electrodes; a source of electrical excitation; coupling means connected between the source of electrical excitation and said first and second spaced-apart electrodes to ground one of said first and second electrodes, to power the other of said electrodes to induce a hollow-anode glow discharge in the grounded one of the first and second electrodes and to cause ions of selected energy to be moved to the substrate; the grounded one of the first and second electrodes having a plurality of holes thereinthrough in which the hollow-anode glow discharge occurs and through which the high-energy ions produced by the high-energy source in the first substrate surface processing medium forming region communicate with the second substrate surface processing medium forming region and synergistically enhance the hollow-anode glow discharge by providing a larger percentage of ions of the selected energy in the second substrate surface processing medium forming region than would otherwise be present therein at a given low-pressure operation point thereby providing improved efficiency selected energy processing at pressures lower than and densities higher than heretofore thought possible. The high energy source is a magnetically-enhanced source in the exemplary embodiment although RFI (Radio Frequency Induction) and ECR (Electron Cyclotron Resonance) or other high-energy sources may be employed without departing from the inventive concept.

BRIEF DESCRIPTION OF THE DRAWINGS

These and other objects, features and advantages of the present invention will become apparent as the invention becomes better understood by referring to the following solely exemplary and non-limiting detailed description of the presently preferred embodiments thereof, and to the drawings, wherein:

FIG. 7 is a graph useful in explaining the principles of the uniformizing grid for chemically-dominated processing in accord with the present invention;

FIG. 8 illustrates in the FIGS. 8A, 8B thereof top plan and side sectional diagrams of one exemplary embodiment of an improved low-pressure grid for both ion-dominated and chemically-dominated processing in accord with the present invention.

DETAILED DESCRIPTION OF THE PREFERRED EMBODIMENTS

Figure 1A:
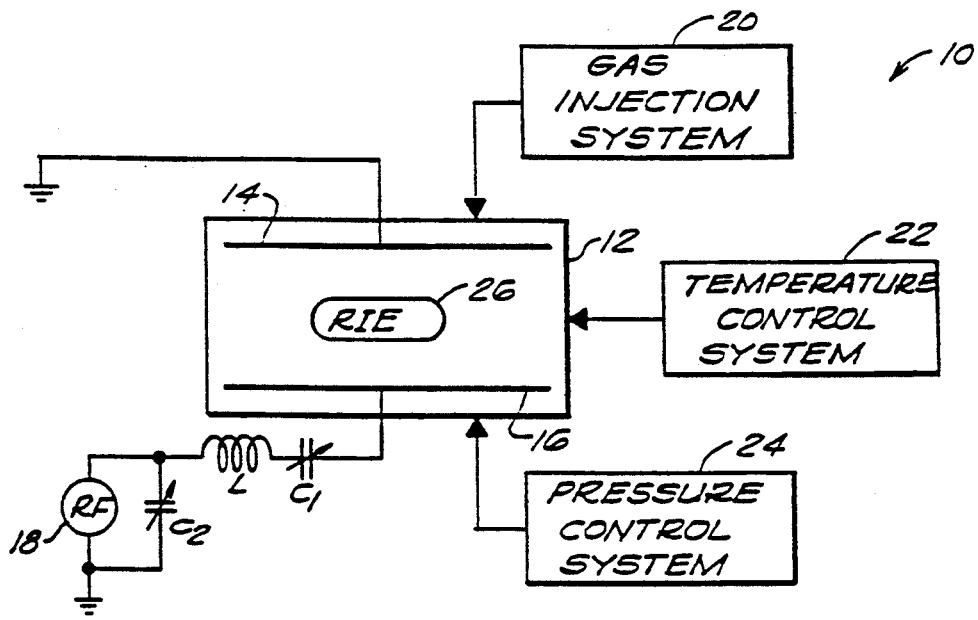
FIG. 1 illustrates in the FIGS. 1A, 1B thereof schematic diagrams respectively of a typical prior-art diode reactor and of a triode reactor of the type disclosed and claimed in commonly-assigned U.S. Pat. No. 5,013,400 to Kurasaki et al.

Referring now to FIG. 1A, generally designated at 10 is a schematic diagram illustrating a typical diode reactor of the prior art. The reactor 10 includes a reaction vessel 12 having two (2) electrodes 14 and 16 in spaced-apart relation. The upper electrode 14 is grounded and the bottom electrode 16, upon which a substrate to be processed, not shown, is releasably mounted, is coupled to a source of electrical excitation 18 designated "RF" via a matching network that includes a variable capacitor marked "$C_1$" and an inductor marked "L" in series between the electrode 16 and the source of electrical excitation 18 and a variable capacitor marked "$C_2$" in parallel with the source of electrical excitation 18.

A gas injection system 20 is coupled to the reaction vessel 12 for injecting reactants in gas phase thereinto, a temperature control system 22 is coupled to the reaction vessel 12 for controlling the temperature of the vessel and the electrodes therewithin and a pressure control system 24 is coupled to the reaction vessel 12 for controlling the pressure therewithin.

The upper electrode 14, because it is grounded, looks to be at a lower potential than the powered electrode 16, whereby the upper electrode 14 is referred to as the "anode" and the lower, powered electrode 16 is referred to as the "cathode". A reactive ion etch (RIE) plasma schematically illustrated by ellipse 26 and marked "RIE" is controllably produced between the anode 14 and the cathode 16 in the reaction vessel 12 of the reactor 10 in well-known manner.

Figure 1B:
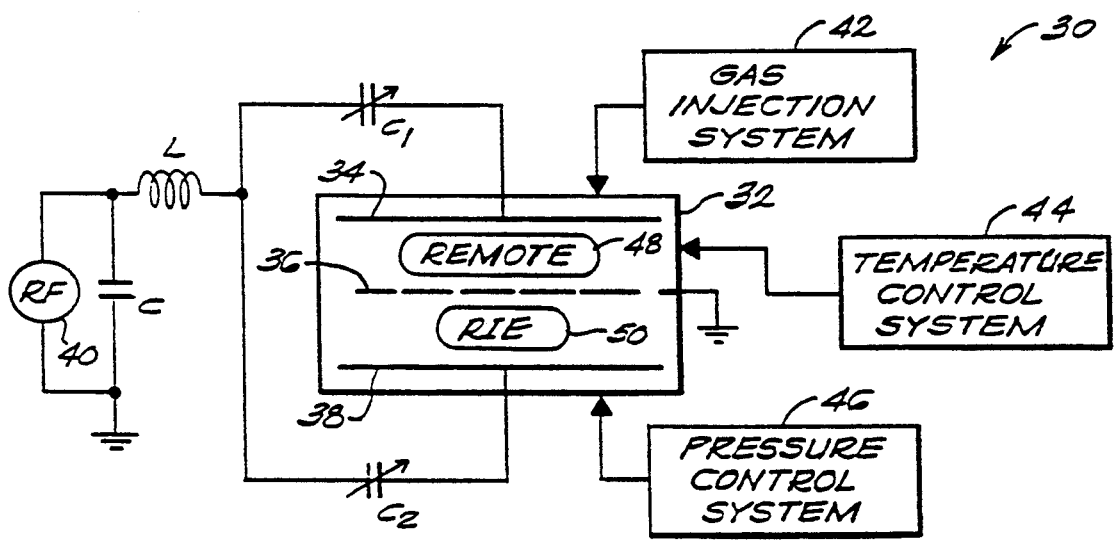

Referring now to FIG. 1B, generally designated at 30 is a schematic diagram of a triode reactor of the type shown and described in commonly-assigned U.S. Pat. No. 5,013,400 to Kurasaki et al. that issued May 7, 1991, entitled DRY ETCH PROCESS FOR FORMING CHAMPAGNE PROFILES, AND DRY ETCH APPARATUS, incorporated herein by reference. The triode reactor 30 includes a reaction vessel 32 into which an upper electrode 34, a grounded grid 36 and a lower electrode 38 are mounted in spaced-apart relation in a triode configuration. The upper electrode 34 and the bottom electrode 38 are coupled to a source of electrical excitation 40 marked "RF" respectively via variable capacitors marked "$C_1$" and "$C_2$" along a circuit path that includes a series inductor marked "L" and a capacitor marked "C" in parallel to the source of electrical excitation 40.

A gas injection system 42 is coupled to the reaction vessel 32 to controllably inject selected reactants in gas phase thereinto, a temperature control system 44 is coupled to the reaction vessel 32 to control the temperature of the electrodes thereof as well as the temperature of the vessel 32 and a pressure control system 46 is coupled to the reaction vessel 32 to establish and maintain a selected operating pressure. In the preferred embodiment, the gas injection system 42 includes a gas diffuser, not shown, positioned between the upper electrode 34 and the grid 36, and the upper electrode 34 is provided with a plurality of holes therethrough, not shown, through which the injected gas flows into the reaction vessel 32.

The temperature control system 44 in the preferred embodiment includes passageways, not shown, within the upper electrode 34 that allow the circulation of the a transport fluid, such as water, therethrough to control the temperature thereof. Bores, not shown, are preferably provided into the vessel 32 that receive resistive heating elements to control the temperature of the reaction vessel, and the lower electrode has apertured bores therein, not shown, to allow the circulation of a heat transport fluid, such as helium, thereinthrough to control the temperature of the bottom electrode 38. The lower electrode 38 also has apertures therethrough, not shown, to allow the circulation of a heat transport fluid, such as water, to control its temperature.

The grid electrode 36 is electrically grounded, as illustrated. It is apertured uniformly by holes whose widths are not larger than four and nine-tenths (4.9) mm. The source of electrical excitation 40 is coupled to the upper electrode 34 and to the lower electrode 38 via the variable capacitors "$C_1$", "$C_2$", which enable to selectively form only a plasma 48 marked "Remote" between the upper electrode 34 and the grid 36, to form only a plasma 50 marked "RIE" between the grid 36 and the lower electrode 38 and to form plasmas between the upper electrode 34 and grid 36 as well as between the grid 36 and the lower electrode 38.

The pressure control system 46 in the preferred embodiment includes a pressure controller, not shown, that preferably receives feedback from a pressure manometer, not shown, positioned inside the reaction vessel 32. The controller responds to chamber set point pressure selected from a pressure range that includes fifty (50) mTorr to three-thousand (3,000) mTorr and to the pressure reading supplied by the manometer to controllably throttle an orifice valve, not shown, coupled between the reaction vessel 32 and a pump, not shown, to establish and maintain the corresponding set point pressure in the reaction vessel 32. Other pressure ranges, such as from one (1) Torr to ten thousand (10,000) mTorr, may, of course, be provided.

In one operational mode of the triode reactor 30 of FIG. 1B, only the RIE plasma 50 may be provided by supplying all power to the bottom electrode 38 but no power to the upper electrode 34, with the grid 36 grounded. The so-operated triode reactor 30 of FIG. 1B, and the diode reactor 10 of FIG. 1A, that likewise produces a RIE plasma 26 between the electrodes 14 and 16 thereof, have identical electrode and plasma configurations. However, when the same reaction is run in the diode reactor 10 and the triode reactor 30 operated as a diode reactor, it has been found that the diode reactor 10 and the triode reactor 30 configured as a diode reactor unexpectedly produce quite different process characteristics. For example, for an exemplary etch by means of the process of reacting $C_2F_6$ with $SiO_2$ to provide silicon dioxide etching in both the diode reaction 10 and the triode reactor 30 operated as a diode of the FIGS. 1A, 1B, the etch rate for the diode reactor 10 is measured to decrease as the pressure in the diode reactor decreases, while the triode reactor 30 configured as a diode reactor maintains its etch rate at a comparatively high level notwithstanding that the pressure decreases. Below about one hundred (100) mTorr, the etch rate becomes only a few hundred angstroms per minute for the diode reactor 10, while at about the same one hundred (100) mTorr pressure in the triode reactor 30 configured as a diode reactor, the etch rate remains on the order of thousands of angstroms per minute, a factor of about twenty (20) better than that of the standard RIE etch in the diode reactor 10.

In addition to the unexpected difference in pressure performance, it has been found that the uniformity exhibited for the same exemplary etch in the diode reactor 10 of FIG. 1A is different from the uniformity provided by the triode reactor 30 of FIG. 1B notwithstanding that the triode reactor 30 is configured and operated as a diode reactor. For the diode reactor 10 of FIG. 1A, the etch rate is high in regions at and near the center of the wafer while at the edge thereof the etch rate is low; for the triode reactor 30 of FIG. 1B operated as a diode reactor, the uniformity maintains itself across the wafer and does not show the same variation between the center and the edge thereof as the diode reactor 10 of FIG. 1A does.

The present invention is based in the recognition that these and other differences in etch rates and in uniformity are attributable to a hollow-anode glow discharge to be described that occurs in the voids themselves of the grid of the triode reactor 30 of FIG. 1B that dominates the RIE plasma and sustains the etch rate and provides the uniformity even at the low pressures where the otherwise identical RIE plasma in the diode reactor 10 of FIG. 1A distorts the uniformity of processing and/or extinguishes itself. This phenomenon, heretofore unrecognized, enables glow discharge apparatus to be constructed in accord with the present invention that provides improved uniformity, efficiency and low-pressure operation.

Figure 2:
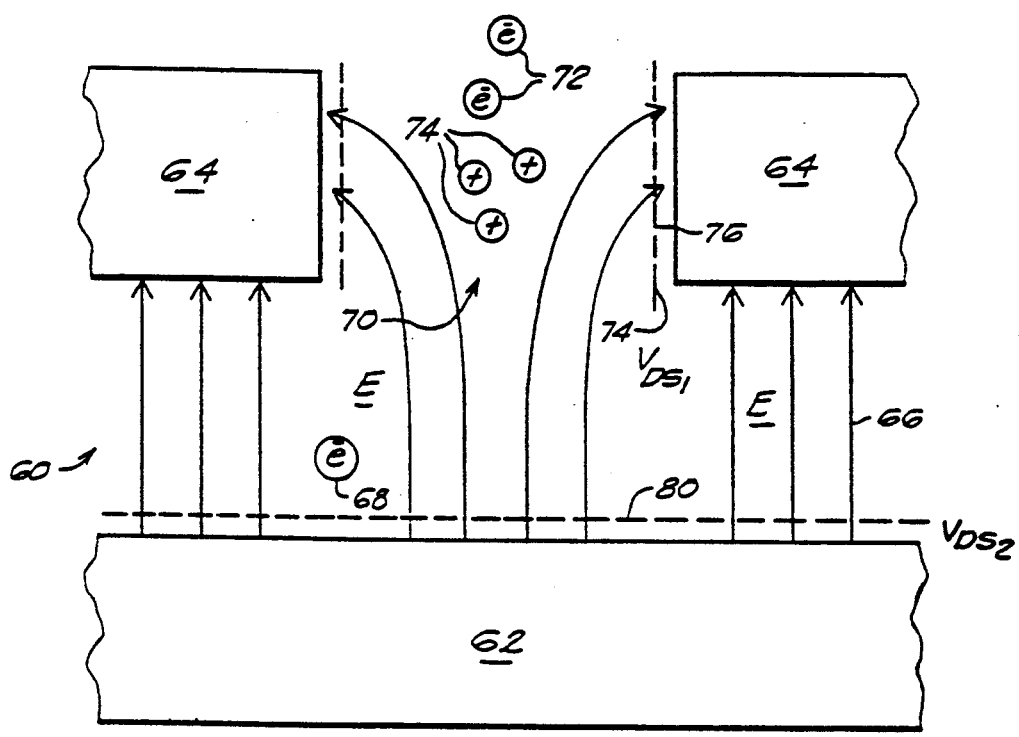
FIG. 2 is a pictorial diagram useful in explicating the principles of the present invention.

Referring now to FIG. 2, generally designated at 60 is a pictorial diagram useful in explicating the principles of the present invention. Between a powered bottom electrode generally designated 62 and a grounded grid generally designated 64 of the triode reactor 30 (FIG. 1B) an electric field 66 marked "E" extends. Electrons schematically illustrated by circles 68 marked "e" that are present in the RIE plasma forming region defined between the electrodes 62, 64 are accelerated by the field 66 to the grid 64. Some of the electrons 68 collide with the inside walls defining at least one hole generally designated 70 through the grid 64, and for each such electron 68, plural electrons 72 schematically illustrated by circles marked "e" are generated by the process of secondary emission. The secondary electrons 72, in turn, are trapped in each of the at least one hole 70 and oscillate back and forth between the confronting inside walls defining the hole.

The oscillating secondary electrons 72 collide with gas molecules present within the void of the at least one hole 70 producing ions thereby schematically illustrated by circles 74 marked "+" in great numbers. The secondary electron and ion generation processes avalanche, and breakdown occurs, whereby a hollow-anode glow discharge is produced in each of the voids of the at least one hole 70 that is characterized by an enhanced electron density along the axis of each of the at least one holes.

In accord with the present invention, about the periphery of each of the at least one holes 70, a dark space sheath of no-glow schematically illustrated by dashed lines 76 is formed that has a potential marked "$V_{DS1}$". The intensity of the glow discharge in each of the holes 70 is related to the hole size, and the spacial extent of the dark space sheath 76 is inversely related to the pressure in the corresponding hole 70. A dark space sheath of no-glow schematically illustrated by dashed line 80 having a potential marked "$V_{DS2}$" is formed about the powered electrode 62, which typically adopts a negative DC bias voltage.

FIG. 3 in the FIGS. 3A–3D thereof illustrates the variation in saturated ion current plotted as the ordinate, with Z position in the reactor plotted as the abscissa, where the one and five tenths (1.5) abscissa value corresponds to the grid position in the reactor for an exemplary $C_2F_6$ chemistry, and where the values of the ordinates were measured by a Z profilometer. As shown by a graph 82 in FIG. 3A, which represents ion current with position in Z for a "holeless" grid, the ion current peaks at less than one hundred fifty (150) microamperes for the region below the grid. The graphs 84, 86 and 88 respectively of the FIGS. 3B, 3C and 3D, which severally correspond to grids have plural, uniformly-sized apertures therethrough of seven (7) mm, eleven (11) mm and seventeen (17) mm diameters, represent the way the saturation ion current varies as the size of the holes through the grid is changed. The ion current in each of the graphs 84, 86 and 88 peaks at the grid location at a maximum value that depends on the applied power (compare the several peaks at one hundred (100), two hundred (200) and three hundred (300) watts) for the exemplary $C_2F_6$ chemistry.

Figure 4A:
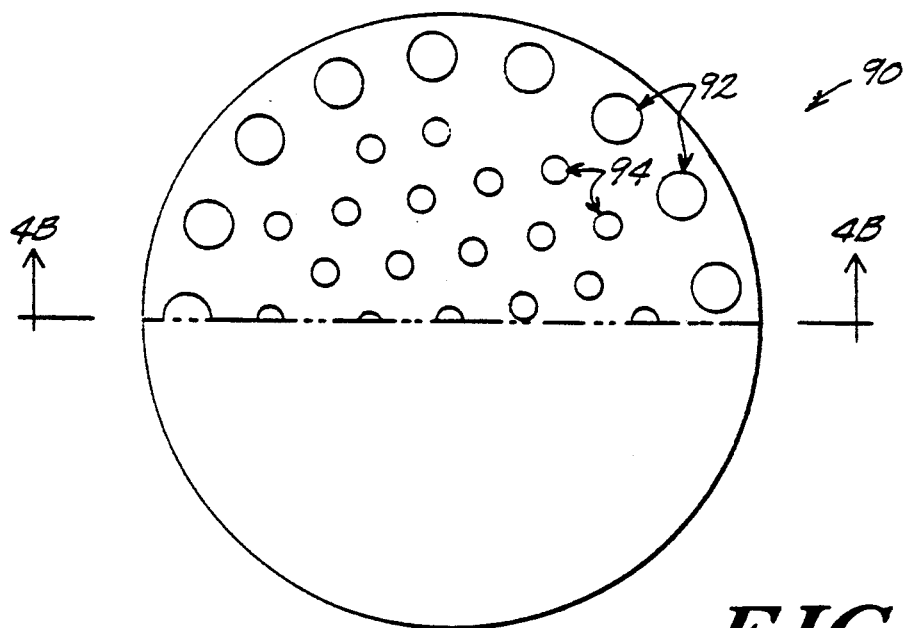
FIG. 4 illustrates in the FIGS. 4A, 4B thereof top plan and side sectional diagrams of one exemplary embodiment of a uniformizing grid for ion-dominated processing in accord with the present invention.
Figure 3A:
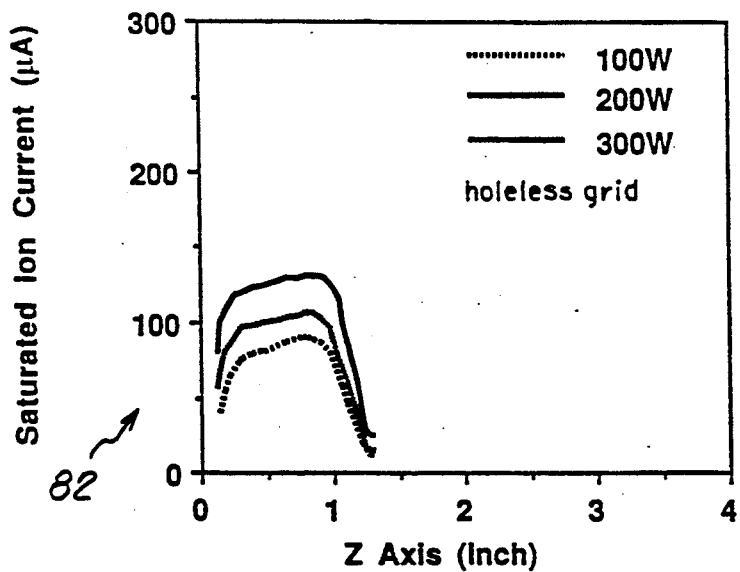
FIG. 3 in the FIGS. 3A-3D thereof illustrates variation in saturated ion current with reactor Z position for "holeless" and grids of differently-sized holes.
Figure 3B:
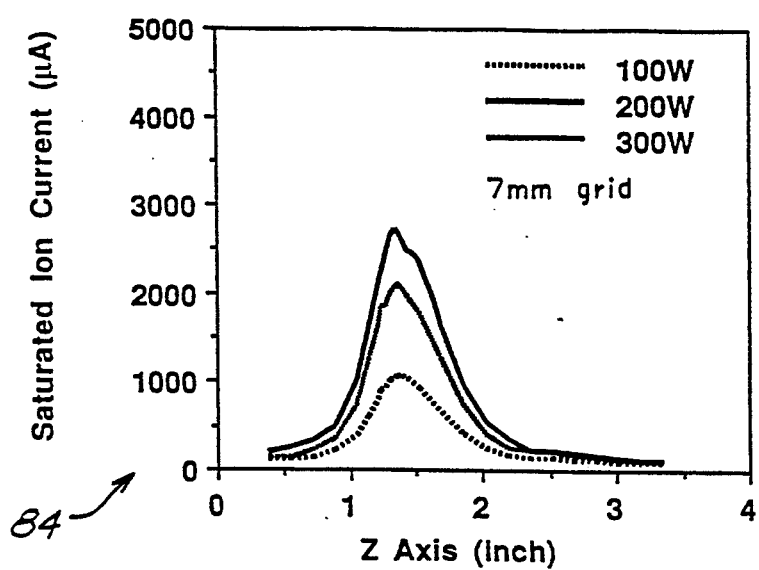
Figure 3C:
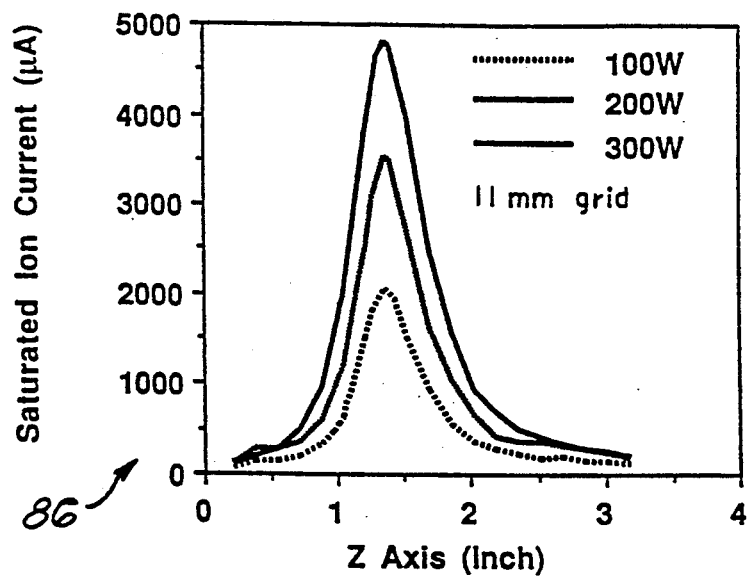
Figure 3D:
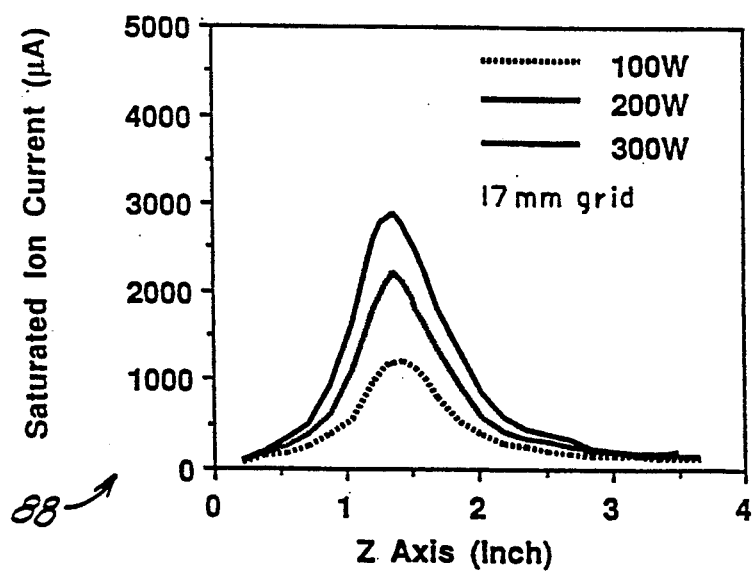
Figure 4B:
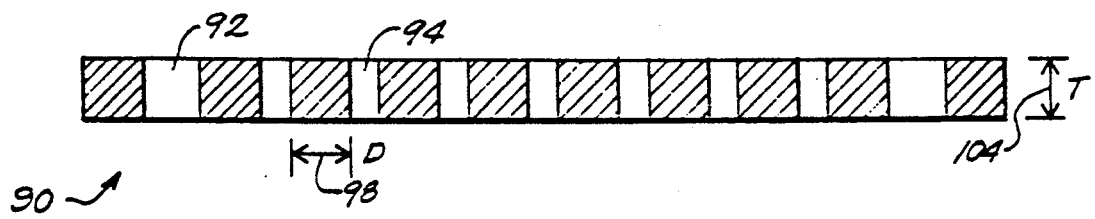

Referring now to FIG. 4, generally designated at 90 is a high-energy-density uniformizing grid for ion-dominated processing in accord with the present invention. The grid 90 in the preferred embodiment is mounted within the triode reactor 30 of FIG. 1B, although it could be mounted within the diode reactor 10 of FIG. 1A or in any other reactor configured either as a diode or a triode or other multi-electrode reactor without departing from the inventive concept. In whatever reactor in which it is mounted, the grid 90 is preferably grounded and the substrate supporting electrode is powered in order to induce a hollow-anode glow discharge in each of the holes thereof.

The grid 90 has at least first and second groups of holes respectively designated generally at 92, 94 thereinthrough of preselected different characteristics, at which the high-energy-density hollow-anode glow discharge occurs. By changing the size of the holes the intensity of the high-energy-density hollow-anode glow discharge is changed (compare FIG. 3), and the preselected different characteristics of the at least first and second groups of holes 92, 94 are selected to provide substantial uniformity of substrate surface processing over the entire surface of the substrate. In the preferred embodiment, the characteristic is selected to be differential aperture width respectively of the holes of the at least first and second groups 92, 94. The grid 90 having the illustrated concentrically arranged groups of differentially sized holes 92, 94 provides substantial uniformity for the exemplary ion-dominated etch discussed in connection with the description of FIG. 1. Other arrangements of holes of different sizes and more than two groups of holes of different sizes may be employed without departing from the inventive concept.

The hollow-anode glow discharge in each of the several holes of the grid 90 proceeds downwardly towards the substrate from the grid, and it both drops in intensity and expands the closer it gets to the confronting surface of the substrate. To prevent the replication of the hole pattern on the substrate, it is preferred that the intrahole spacing between holes of the same size and the interhole spacing between holes of different sizes be selected to be that minimum dimension 98 marked "D" that ensures overlap of the several hollow-anode glow discharges of intragroup and intergroup holes at the surface of the substrate. In the exemplary embodiment, the dimension 98 is about two-tenths (0.2) mm although other hole spacings may be employed to prevent hole pattern replication in dependance on the particular ion-dominated process selected. While in the preferred embodiment the space between the holes of the same and different sizes is selected to be the same dimension in order to prevent duplicating the hole pattern on the wafer or other substrate, other hole spacing arrangements may be employed in accord with the instant invention so long as the pattern of the holes of the at least first and second groups of holes is not duplicated on the substrate.

The thickness 104 marked "T" of the grid 90 need only be not too thin as to not support a hollow-anode glow discharge in the several holes while not too thick as to extinguish the same. For the exemplary embodiment 90, thicknesses from twelve hundredths (0.12) mm to six and three-tenths (6.3) mm have been found to be effective, although other thickness may be employed without departing from the inventive concept. Any suitable material, such as aluminum, that does not deform or melt may be selected for the material of the grid 90.

Figure 5:
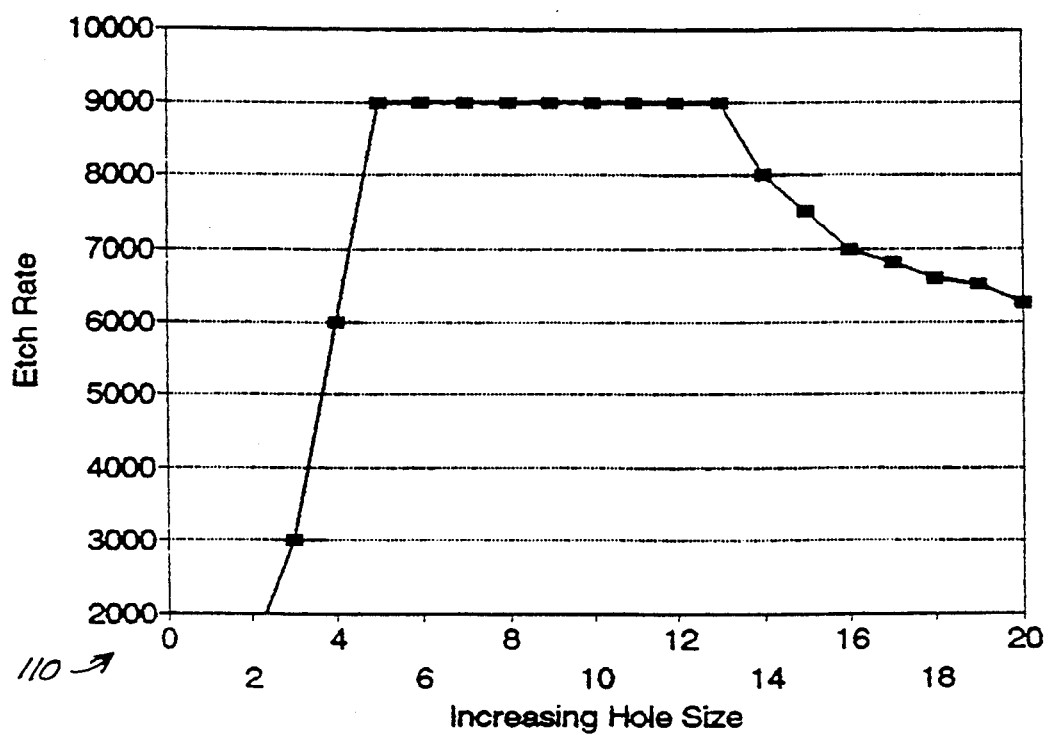
FIG. 5 is a graph useful in explaining the principles of the uniformizing grid for ion-dominated processing in accord with the present invention.

Referring now to FIG. 5, generally designated at 110 is a graph useful in explaining the principles of construction of a high-energy-density uniformizing grid for an exemplary ion-dominated process in accord with the present invention. The exemplary ion-dominated process is etching of a semiconductor wafer by the chemistry $C_2F_6$. The graph 110 plots an index of the particular substrate surface process selected as the ordinate, here "etch rate", with increasing hole size as the abscissa.

The graph 110 is exemplary of one procedure that may be employed in constructing a high-energy-density uniformizing grid for ion-dominated processes in accord with the invention. For an intended pressure, different grids with different uniformly-sized holes are severally mounted in the triode reactor 30 of FIG. 1B and measurements are taken of the etch rate obtained for each grid of different uniformly-sized holes. In the graph 110, those etch rates are plotted as data points schematically illustrated by the solid boxes thereof. Lower pressure set-points shift the graph 110 to the right, and higher pressure set-points shift the graph 110 to the left. To design a uniformizing grid, profilometer measurements are taken of the uniformity of etch rate across a substrate using a grid of one selected size hole, such as that at the midpoint of the graph 110. Departures from uniformity above and below the intended etch rate are compensated by referring to the graph 110 and selecting that hole size that gives the intended etch rate for those regions where the etch rate departs from uniformity. A grid with groups of holes of different sizes selected to provide uniformity is then constructed, profilometer measurements are taken, and the same process may be repeated until substantial uniformity is obtained. Graph 110 is exemplary only, and it will be appreciated that the high-energy-density uniformizing grid for ion-dominated processing of the invention may be designed for other ion-dominated processes by means of other control grids and design methodologies and by gathering other kinds of data about different dimensions and parameters and along different directions than that illustrated by the graph 110 without departing from the inventive concept.

Figure 6A:
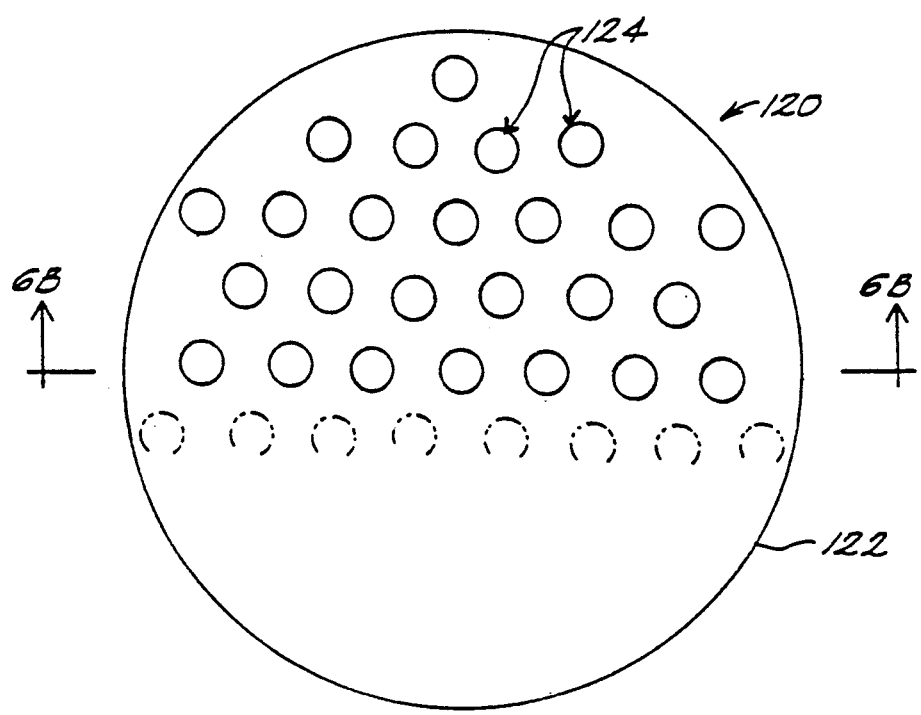
FIG. 6 illustrates in the FIGS. 6A, 6B thereof top plan and side sectional diagrams of one exemplary embodiment of a uniformizing grid for chemically-dominated processing in accord with the present invention.
Figure 6B:
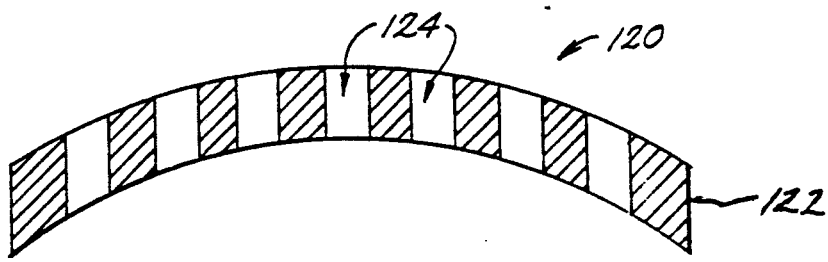

Referring now to FIG. 6, generally designated at 120 is a high-energy-density uniformizing grid for chemically-dominated processing in accord with the present invention. Like for the case of the high-energy-density uniformizing grid for ion-dominated processing 90 of the embodiment of FIG. 4, the grid 120 may be mounted in any suitable two-electrode or three-electrode or other multi-electrode reactor, the triode reactor of FIG. 1B being the presently preferred embodiment. Unlike for the case of the high-energy-density uniformizing grid for ion-dominated processing 90 of the exemplary embodiment of FIG. 4, where it is differential hole size that determines the relative intensity of the high-energy-density hollow-anode glow discharge, and that is selected to provide substantial uniformity of substrate surface processing over the entire surface of the substrate, the grid 120 of the exemplary embodiment of FIG. 6 for chemically-dominated processing has a preselected non-planar profile that departs from planarity in a manner selected to provide substantial uniformity of substrate surface processing over the entire surface of the substrate being processed for the selected chemically-dominated process. In accord with the present invention, the local intensity of the hollow-anode glow discharge is determined by the local spacing of the grid from the substrate to be processed which, by controllably changing the spacing, enables to provide substantial uniformity of substrate surface processing for any selected chemically-dominated processes.

In the exemplary embodiment, the uniformizing grid 120 includes a member 122, such as of aluminum, through which a plurality of equal-sized holes generally designated 124 are provided in uniformly spaced-apart relation. In the exemplary embodiment, the preselected non-planar profile of the grid 120 is selected to be continuously arcuate in two-dimensions with centrally-positioned holes spaced further from the substrate than peripherally-positioned holes. The thickness of the grid 120 should be not too thin that the uniformizing grid 120 would melt, nor too thick that the high-energy-density glow discharge would extinguish itself. Typical values of thicknesses range from twelve hundredths (0.12) mm to six and three tenths (6.3) mm, although other thicknesses may be employed without departing from the inventive concept.

For any selected chemically-dominated process the non-planar profile is selected to provide substantial uniformity over the entire surface of the wafer for the chemically-dominated process selected. To determine the specific non-planar profile that corresponds to a particular chemically-dominated process selected, measurements of an index of the selected chemically-dominated process are made at points spaced about the entire surface of the substrate using a planar grid mounted a first predetermined distance from the substrate. The planar grid is then remounted in the reactor, but at a different predetermined distance from the substrate, and the index of the particular chemically-dominated process selected is measured at the same substrate points. The process of remounting the planar grid and measuring the index of the selected chemically-dominated process for the same set of substrate points is repeated a predetermined number of times. Each set of measurements of the index with location about the same points of the substrate is parametricized by the particular value of the spacing of the planar grid from the substrate for a substantially constant index; that spacing that gives the same index at each of the points is taken directly or by extrapolation from the measurements or by other calculating techniques. This spacing specifies the way the non-planar profile departs from planarity to provide substantial uniformity for the particular chemically-dominated process selected. Discrete (stepped) non-planar profiles and continuous non-planar profiles other than the concave grid 120 of the exemplary embodiment may be employed without departing from the inventive concept.

Referring now to FIG. 7, generally designated at 130 is a graph that plots electrode spacing in inches as the ordinate with location in millimeters from the edge of the wafer as the abscissa parametricized for different uniform etch rates at different pressures as illustrated by the curves 132, 134, and 136 thereof. The graph 130 was experimentally obtained on a modified diode chamber with an electrostatic chuck, in which the grounded grid was hung from the upper electrode with a teflon baffle around the sides. The particular chemically-dominated process selected was an aluminum etch.

The samples that were used were six (6) inch aluminum five-tenths percent (0.5%) Cu wafers that had been DUV (deep ultraviolet) baked at two-hundred (200) C°. A three factor quadratic design with three (3) replicate points was used to produce an eighteen (18) run experiment. Held constant during the experiment were fifty (50) sccm Cl, fifteen (15) sccm SiCl4, three-hundred (300)W, and ten (10) torr He backside pressure. The factors that were varied were pressure (60 mt–120 mt), electrode spacing (0.25"–1.25"), and grounded grid hole size (3/16"–⅜"). All the wafers were partially etched and profilometer measurements were taken at fourteen (14) points along the diameter of each wafer. The measurements were taken before etch, after etch, and after resist strip. From this data the aluminum (Al) etch rate and resist etch rate were calculated at each of the fourteen (14) points on each wafer. The responses that were measured were the average aluminum and resist etch rates across the wafer, and the etch rate uniformities. A detailed picture of uniformity was obtained by analyzing the experimental results using, as the responses, the etch rates at seven (7) points from the edge to the center of the wafer. Data from these plots were used to generate the curves 132, 134, 136 of FIG. 7 to plot electrode spacing with wafer location for a given etch rate. The data points for each curve are marked on the contour plots to illustrate how the curves were created. The curves show what spacing is needed to produce a specific etch rate at a specific location on the wafer. The curves represent the shape of the grounded grid needed to produce a uniform etch rate across the wafer for the exemplary chemically-dominated process selected. Other chemically-dominated processing, other control grids and design methodologies and other ways of gathering data than that of the FIG. 7 may be employed without departing from the inventive concept.

Referring now to FIG. 8, generally designated at 140 is a high-energy-density low-pressure grid in accord with the present invention. The grid 140 preferably is mounted within the triode reactor 30 of FIG. 1B but it may be mounted in the diode reactor 10 of FIG. 1A or any other reactor configured as a diode or triode or other multi-electrode reactor without departing from the inventive concept. The grid 140 has a plurality of holes generally designated 142 therethrough of preselected width selected to be larger than four and nine tenths (4.9) millimeters and typically eleven (11) millimeters. As described above in connection with the description of FIG. 1, when the pressure in the reactors in either the diode or the triode configurations is reduced beyond a certain threshold, below about one hundred (100) mTorr for the triode reactor 30 of FIG. 1B and below about eight hundred (800) mTorr for the diode reactor 10 of FIG. 1A, processing efficiency either becomes impracticable or processing stops altogether, with the result that a limit was reached on the type, scale and fineness of microstructures capable of being fabricated by the heretofore known reactors configured either as diode or triode or other multielectrode reactors. In accord with the present invention, by means of providing the grid 140 with holes none of which have widths that are sized to be smaller than or equal to four and nine tenths (4.9) mm, and which typically are eleven (11) mm, the lower limit on the practicable pressures heretofore is overcome enabling the fabrication of microstructures of sizes and of degrees of fineness not heretofore thought possible. On the heretofore existing triode reactors, the aperture widths of the grid were all no bigger than four and nine-tenths (4.9) millimeters. The dark space in the holes of the grid, which, as described hereinabove, is a function of both the pressure and the applied radio frequency excitation, increases as the pressure decreases. For the hole sizes heretofore, the dark space in the holes effectively extinguished and/or distorted the hollow-anode glow discharge of the grounded grid at the minimum pressure levels heretofore, whereby the geometries of the microstructures that were able to be formed were "frozen" at magnitudes larger than desirable for present and future VLSI and other applications.

In accord with the present invention, the holes are large enough that the hollow-anode glow discharge in the grid 140 maintains itself notwithstanding the size of the dark space in the voids of the grid at pressures below the minimum pressures heretofore, thereby enabling the triode reactor 30 of FIG. 1B with the grid 140 to provide substrate surface processing at pressures selected below the minimum pressures heretofore. The grid 140 in accord with the present invention enables in this manner to provide substrate surface processing at a range of pressures heretofore thought impossible, and thereby it enables to fabricate microstructures of a type, scale and fineness that were heretofore not thought possible. While aperture widths of eleven (11) millimeters are preferred for the exemplary embodiment of the grid 140, other aperture widths sized above the minimum width of four and nine tenths (4.9) mm yield a plasma and a corresponding increase in ion density that are at least an order of magnitude greater than that heretofore thought possible.

Figure 9:
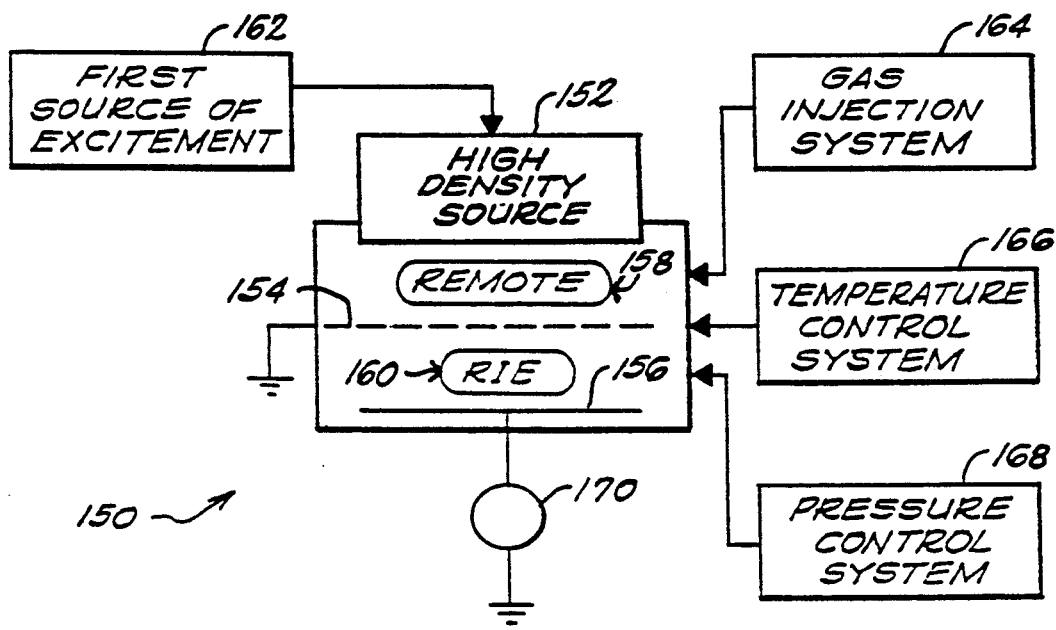
FIG. 9 is a schematic diagram illustrating one exemplary embodiment of an improved low-pressure, selected-energy substrate surface processing apparatus for ion-dominated and/or chemically dominated processing in accord with the present invention.

Referring now to FIG. 9, generally designated at 150 is an embodiment of the invention for improved low-pressure selected-energy ion-dominated and/or chemically-dominated processing. Instead of the upper electrode 34 of the triode reactor 30 of FIG. 1B, a high density source 152 is provided inside the reaction vessel in spaced apart relation to a grounded grid 154, which in turn is in spaced-apart relation to a lower electrode 156. Between the high-density source 152 and the grid 154 a first substrate surface processing medium forming region generally designated 158 and marked "remote" is provided and, between the grid 154 and the lower electrode 156, a second substrate surface processing medium forming region generally designated 160 and marked "RIE" is provided. The high density source may be any suitable source such as a radio frequency induction (RFI) source, an electron cyclotron resonance (ECR) source, a magnetically-enhanced source, and among others, a helical resonator well-known to those skilled in the art.

A first source of excitation 162 is coupled to the high-density source 152 to energize the same. A gas injection system 164, a temperature control system 166 and a pressure control system 168, that correspond to the elements 42, 44 and 46 of FIG. 1B, are coupled to the reaction vessel and function in substantially the same manner as in the embodiment 30 of FIG. 1B, and are not specifically described again herein for the sake of brevity of explanation.

The high-energy-density source 152 boosts the efficiency of the hollow-anode glow discharge produced by the grounded grid 154; the high-energy ions produced by the high density source 152 in the first substrate surface processing medium forming region 158 communicate with the second substrate surface processing medium forming region 160 through the holes of the grid 154 and synergistically enhance the hollow-anode glow discharge in the grid 154 by providing a comparatively larger percentage of ions of selected energy in the second substrate surface processing region than would otherwise be present therein at a given low-pressure operation point. The ions of the high density source 152 synergistically cooperate with the hollow-anode glow discharges of the grounded grid to provide a greater percentage of ions in the region 160, which ions may be selectively extracted by controllably biasing the lower electrode 156 by means of a controllable negative RF source 170. The controllable source 170 creates a negative potential whose magnitude may be varied to extract from the upper region 158 ions of a particular energy level. In polysilicon etching, for example, where it is desirable to use the minimum ion energy necessary to create anisotropic etching of the film, selection of minimum energy ions is desirable to prevent charge build-up and gate oxide damage, which minimum energy ions can readily be selected by varying the potential of the ion selector 170 to apply the corresponding negative potential on the lower electrode that attacks ions of the selected energy. Other applications of the embodiment 150 may, of course, be implemented without departing from the inventive concepts.

While in the embodiments described herein the preferred biasing provides a hollow-anode glow discharge, where the grid is grounded, it should be understood that the grid may be powered, and a hollow-cathode glow discharge, such as for film removal, may also be provided without departing from the inventive concept. It should also be understood that the inventive apparatus of the several embodiments described herein, such as the grid embodiment 90 (FIG. 4) primarily for ion-dominated processes and the grid embodiment 120 (FIG. 6) primarily for chemically-dominated processes, may be combined, such as by providing the high-energy-density uniformizing grid 90 or 120 in the reactor 150 (FIG. 9), without departing from the inventive concept.

Many modifications of the presently disclosed invention will be apparent to those skilled in the art having benefitted from the instant disclosure without departing from the inventive concept.

What is claimed is:

1. Ion-dominated substrate surface processing apparatus, comprising:
    a reaction vessel;
    at least first and second spaced-apart electrodes mounted in the reaction vessel and defining a substrate surface processing medium forming region between the first and second spaced-apart electrodes;
    a substrate holder proximate one of the electrodes;
    gas injecting means for injecting substrate surface processing medium forming reactants into the reaction vessel;
    at least one source of electrical excitation;
    coupling means connected between the at least one source of electrical excitation and the at least first and second spaced-apart electrodes to induce a hollow-anode glow discharge in one of the electrodes;
    said one of said electrodes having at least first and second groups of holes of preselected different characteristics therein through in which said hollow-anode glow discharge occurs, the preselected different characteristics of the holes of the groups of holes are selected to provide substantial uniformity of substrate surface processing over the entire surface of the substrate.

2. The invention of claim 1, wherein said one of the electrodes is a grounded electrode.

3. The invention of claim 2, wherein the preselected characteristics of the holes of the at least first and second groups of holes of the grounded electrode are selected to be differential sizing.

4. The invention of claim 2, wherein the holes of the differentially sized groups of holes are spaced apart a uniform preselected distance selected to allow their corresponding hollow-anode glow discharges to overlap at the substrate in such way as to prevent replication of the pattern of the holes of the groups of holes on the substrate.

5. The invention of claim 2, wherein the grounded one of the electrodes is a metallic plate, and wherein the holes of the groups of holes through the metallic plate are of uniform length.

6. The invention of claim 1, wherein the preselected characteristics of the holes of the at least first and second groups of holes of said one of the electrodes are selected to be differential sizing.

7. Chemically-dominated substrate surface processing apparatus, comprising:
    a reaction vessel;
    at least first and second spaced-apart electrodes mounted in the reaction vessel and defining a substrate surface processing medium forming region between the first and second spaced-apart electrodes;
    a substrate holder for holding a substrate proximate one of said electrodes;

a gas injector for injecting reactants into the reaction vessel;

a source of electrical excitation;

coupling means connected between the source of electrical excitation and said at least first and second spaced-apart electrodes to induce a hollow-anode glow discharge in one of said electrodes;

said one of said electrodes having at least one hole thereinthrough in which said hollow-anode glow discharge occurs;

said one of said at least first and second electrodes having a preselected non-planar profile that departs from planarity in a manner selected to provide substantial uniformity of substrate surface processing over the entire surface of the substrate.

8. The invention of claim 7, wherein said one of said electrodes is a grounded electrode.

9. The invention of claim 8, wherein the preselected non-planar profile is selected to be concave.

10. The invention of claim 8, wherein the preselected non-planar profile is selected to be continuously non-planar.

11. The invention of claim 8, wherein the preselected non-planar profile is selected to be discreetly non-planar.

12. The invention of claim 7, wherein the preselected non-planar profile is selected to be concave.

13. The invention of claim 7, wherein the preselected non-planar profile is selected to be continuously non-planar.

14. The invention of claim 7, wherein the preselected non-planar profile is selected to be discretely non-planar.

15. The invention of claim 7, wherein the at least one hole includes plural holes that are uniformly-sized and spaced-apart.

16. Low-pressure substrate processing apparatus, comprising:

a reaction vessel;

at least first and second spaced-apart electrodes mounted in the reaction vessel and defining a substrate surface processing medium forming region between the first and second spaced-apart electrodes;

a substrate holder for releasably holding a substrate proximate one of said first and second spaced-apart electrodes;

a gas injector for injecting substrate surface processing reactants into the reaction vessel;

a source of electrical excitation;

coupling means connected between the source of electrical excitation and the first and second spaced-apart electrodes for inducing a hollow-anode glow discharge in one of said at least first and second electrodes;

pressure control means for selectively establishing a preselected pressure;

said one of said electrodes having at least one hole thereinthrough in which said hollow-anode glow discharge occurs, where each of the at least one holes has a preselected width selected to be larger than four and nine tenths (4.9) mm.

17. The invention of claim 16, wherein each of said at least one holes has a width of eleven (11) millimeters.

18. Low-pressure, selected-energy ion-dominated and/or chemically-dominated substrate surface processing apparatus, comprising:

a reaction vessel;

a high energy source providing high-energy ions;

first and second electrodes spaced apart from each other and the high-energy source and mounted in the reaction vessel defining a first processing medium forming region between the high-energy source and one of the first and second spaced-apart electrodes and defining a second substrate surface processing medium forming region between said first and second spaced-apart electrodes;

a holder for releasably holding a substrate proximate one of said first and second spaced-apart electrodes;

a source of electrical excitation;

coupling means connected between the source of electrical excitation and said first and second spaced-apart electrodes for inducing a hollow-anode glow discharge in one of the first and second electrodes and for selecting ions of particular energy from the first processing medium forming region to be moved to the second processing medium forming region;

said one of the first and second electrodes having at least one hole thereinthrough in which the hollow-anode glow discharge occurs and through which the high-energy ions produced by the high-energy source in the first substrate processing medium forming region communicate with the second substrate surface processing medium forming region and synergistically enhance the hollow-anode glow discharge in said one of the electrodes by providing a larger percentage of ions of the particular energy selected in the second substrate surface processing medium forming region than would otherwise be present therein absent the high-energy-density source.

19. The invention of claim 18 wherein the high energy density source is a magnetically-enhanced source.

20. The invention of claim 19, wherein the high-energy-density source is a radio frequency interference source.

21. The invention of claim 19, wherein the high-energy-density source is an electron cyclotron resonance source.

22. The invention of claim 19, wherein the high-energy-density source is a helical resonator.

* * * * *